(12) United States Patent
Ishida et al.

(10) Patent No.: US 8,035,299 B2
(45) Date of Patent: Oct. 11, 2011

(54) ORGANIC ELECTROLUMINESCENT DISPLAY AND METHOD OF MAKING THE SAME

(75) Inventors: Taizo Ishida, Okazaki (JP); Kahoru Mori, Toyokawa (JP); Ryonosuke Tera, Toyota (JP); Koji Ino, Kariya (JP)

(73) Assignee: Denso Corporation, Kariya (JP)

( * ) Notice: Subject to any disclaimer, the term of this patent is extended or adjusted under 35 U.S.C. 154(b) by 284 days.

(21) Appl. No.: 12/285,705

(22) Filed: Oct. 14, 2008

(65) Prior Publication Data

US 2009/0108747 A1 Apr. 30, 2009

(30) Foreign Application Priority Data

Oct. 26, 2007 (JP) ................................. 2007-279259

(51) Int. Cl.
*H01L 51/50* (2006.01)

(52) U.S. Cl. ........ 313/506; 313/504; 313/512; 428/690; 257/100

(58) Field of Classification Search .................. 313/504, 313/506, 512; 345/76; 428/426, 690; 257/98–100
See application file for complete search history.

(56) References Cited

U.S. PATENT DOCUMENTS

| 5,909,081 A | 6/1999 | Eida et al. | |
|---|---|---|---|
| 6,091,382 A * | 7/2000 | Shioya et al. | 345/76 |
| 2005/0122039 A1 * | 6/2005 | Satani | 313/506 |
| 2006/0017383 A1 * | 1/2006 | Ishida et al. | 313/512 |
| 2006/0087230 A1 * | 4/2006 | Ghosh et al. | 313/512 |
| 2008/0018230 A1 | 1/2008 | Yamada et al. | |
| 2008/0226924 A1 * | 9/2008 | Okubo et al. | 428/426 |

FOREIGN PATENT DOCUMENTS

| EP | 1 115 269 | 7/2011 |
|---|---|---|
| JP | A-2003-229271 | 8/2003 |
| JP | A-2003-282239 | 10/2003 |
| JP | A-2004-039468 | 2/2004 |
| JP | A-2007-194168 | 8/2007 |

OTHER PUBLICATIONS

Office Action mailed on Sep. 15, 2009 from the Japan Patent Office for corresponding application No. 2007-279259 (English translation enclosed).
Office Action mailed on May 10, 2011 issued from the Japanese Patent Office in the corresponding Japanese patent application No. 2007-279259 (English translation enclosed).

* cited by examiner

*Primary Examiner* — Nimeshkumar Patel
*Assistant Examiner* — Mary Ellen Bowman
(74) *Attorney, Agent, or Firm* — Posz Law Group, PLC

(57) ABSTRACT

An organic EL display includes an organic material, a gas barrier layer on the member, and an organic EL unit on the gas barrier layer. The gas barrier layer comprises AlxTiyOz, wherein Al represents aluminum, Ti represents titanium, O represents oxygen, x represents the ratio of atoms of Al, y represents the ratio of atoms of Ti, and z represents the ratio of atoms of O. A Ti-atom ratio of the gas barrier layer is given in the units of atom % and defined by the following equation: Ti-atom ratio=$\{y/(x+y)\} \cdot 100$. The gas barrier layer has a first portion at an interface with the member and a second portion at an interface with the organic EL unit. The Ti-atom ratio of the first portion is 0 atom %. The Ti-atom ratio of the second portion is greater than or equal to 10 atom %.

9 Claims, 9 Drawing Sheets

FIG. 11

| SAMPLE NUMBER | GAS BARRIER LAYER STRUCTURE | DARK-SPOTTED PANEL PER MOTHER | | | | |
|---|---|---|---|---|---|---|
| | | M1 | M2 | M3 | M4 | M5 |
| S1 | AlxTiyOz(12atom%:30nm) | 2 | 0 | 1 | 4 | 2 |
| S2 | AlxTiyOz(0atom%:20nm)/AlxTiyOz(12atom%:10nm) | 0 | 0 | 0 | 0 | 0 |
| S3 | AlxTiyOz(0atom%:10nm)/AlxTiyOz(7atom%:10nm)/AlxTiyOz(12atom%:10nm) | 0 | 0 | 0 | 0 | 0 |
| S4 | AlxTiyOz(0atom%:10nm)/AlxTiyOz(0-12atom%:10nm)/AlxTiyOz(12atom%:10nm) | 0 | 0 | 0 | 0 | 0 |
| S5 | AlxTiyOz(0-12atom%:60nm) | 0 | 0 | 0 | 0 | 0 |
| S6 | AlxTiyOz(0atom%:10nm)/AlxTiyOz(0-28atom%:20nm) | 0 | 0 | 0 | 0 | 0 |
| S7 | AlxTiyOz(0-12atom%:40nm)/AlxTiyOz(12atom%:10nm) | 0 | 0 | 0 | 0 | 0 |

ORGANIC ELECTROLUMINESCENT DISPLAY AND METHOD OF MAKING THE SAME

CROSS REFERENCE TO RELATED APPLICATION

This application is based on and incorporates herein by reference Japanese Patent Application No. 2007-279259 filed on Oct. 26, 2007.

FIELD OF THE INVENTION

The present invention relates to an organic electroluminescent display and a method of making the same.

BACKGROUND OF THE INVENTION

An organic electroluminescent (EL) display, also called an organic light emitting diode (LED) display, generally includes a base substrate, an organic member (e.g., color filter) on the substrate, a gas barrier layer on the organic member, and an organic EL unit on the gas barrier layer.

For example, an organic EL display employing a color filter generally includes a transparent substrate, a color filter layer on the substrate, an overcoat layer on the color filter layer, a gas barrier layer on the overcoat layer, and an organic EL unit that is located on the gas barrier layer and configured to emit white light. The color filter layer and the overcoat layer are made of organic materials.

In such a display, volatile matter (e.g., moisture) volatilizing from the color filter layer or the overcoat layer may cause a dark spot on the organic EL unit and a reduction in luminous efficiency of the organic EL unit. The gas barrier layer blocks the volatile matter so as to prevent the above problems.

For example, JP-A-2007-194168 or US 2006/0017383 corresponding to JP-A-2006-253106 discloses a gas barrier layer formed with a thin film that is represented by the formula $Al_xTi_yO_z$ and formed by an atomic layer deposition method. Typically, such a gas barrier layer has a closely packed structure that improves gas barrier performance.

The $Al_xTi_yO_z$ film is a metal oxide of aluminum (Al) and titanium (Ti). In the formula, the x represents the ratio of atoms of Al, the y represents the ratio of atoms of Ti, and the z represents the ratio of atoms of O. To ensure gas barrier performance, it is required that the $Al_xTi_yO_z$ film be amorphous.

However, depending on the concentration of the Ti of the $Al_xTi_yO_z$ film, a portion of the $Al_xTi_yO_z$ film may change to a crystalline structure that causes a reduction in gas barrier performance. Recently, there has been a strong demand for a gas barrier layer having an improved gas barrier performance for a large-sized display.

SUMMARY OF THE INVENTION

In view of the above-described problem, it is an object of the present invention to provide an organic EL display having an improved gas barrier performance and a method of making the organic EL display.

According to an aspect of the present invention, the organic EL display includes a member made of an organic material, a gas barrier layer on the member, and an organic EL unit on the gas barrier layer. The gas barrier layer comprises $Al_xTi_yO_z$, wherein Al represents aluminum, Ti represents titanium, O represents oxygen, x represents the ratio of atoms of Al, y represents the ratio of atoms of Ti, and z represents the ratio of atoms of O. A Ti-atom ratio of the gas barrier layer is given in the units of atom % and defined by the following equation: Ti-atom ratio=$\{y/(x+y)\} \cdot 100$. The gas barrier layer has a first portion at a first interface with the member and a second portion at a second interface with the organic EL unit. The Ti-atom ratio of the first portion is 0 atom %. The Ti-atom ratio of the second portion is greater than or equal to 10 atom %.

According to another aspect of the present invention, a method of forming the organic EL unit includes forming the gas barrier layer on the member at a temperature less than a decomposition temperature of the member by a vapor deposition method in such a manner that the Ti-atom ratio of the first portion is 0 atom % and that the Ti-atom ratio of the second portion is greater than or equal to 10 atom %. The method further includes forming the organic EL unit on the gas barrier layer.

BRIEF DESCRIPTION OF THE DRAWINGS

The above and other objectives, features and advantages of the present invention will become more apparent from the following detailed description made with check to the accompanying drawings. In the drawings:

FIG. 11 is a diagram illustrating a result of an experiment conducted to evaluate the effect of the gas barrier layer according to the embodiments.

DETAILED DESCRIPTION OF THE PREFERRED EMBODIMENTS

Figure 1:
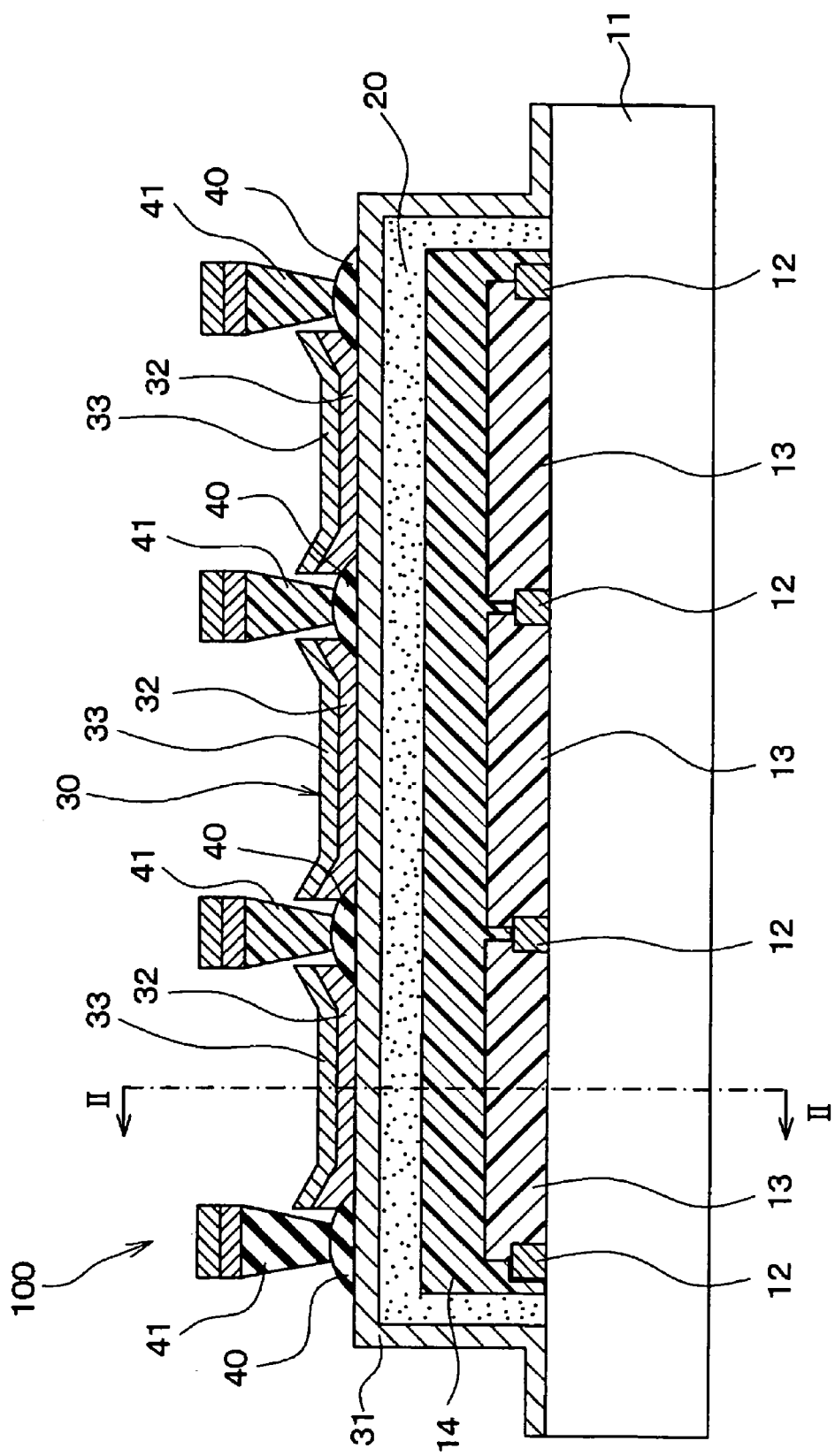
FIG. 1 is a diagram illustrating a cross-sectional view of an organic EL display according to a first embodiment of the present invention.

The present inventors have eagerly studied how to improve gas barrier performance of a $Al_xTi_yO_z$ film used as a gas barrier layer of an organic electroluminescent (EL) display. It is known that an amorphous film generally has the following properties:

a) No diffraction image other than a halo pattern is observed when an amorphous film is examined with a X-ray diffraction method, an electron diffraction method, or the like.

b) No grain boundary is observed in an electron microscopy transmission image of an amorphous film.

c) An application of heat causes an amorphous film to change from amorphous to crystalline. At the same time, the film generates heat, and an electrical resistance of the film greatly changes.

The present inventors have made a single-layer AlxTiyOz film used as a gas barrier layer and compared a dark-spotted portion of the gas barrier layer with a normal portion of the gas barrier layer. Specifically, focused ion beam (FIB) is applied to the center of the dark-spotted portion, and a section of the gas barrier layer is examined with a transmission electron microscope (TEM). As a result, diffraction image other than a halo pattern was observed in the dark-spotted portion of the gas barrier layer. Conversely, only a halo pattern was observed in the normal portion of the gas barrier layer.

In view of the above, the present inventors have concluded that the gas barrier layer locally changes from an amorphous structure to a polycrystalline structure at the dark-spotted portion and that the polycrystalline structure causes a reduction in gas barrier performance of the gas barrier layer. Further, the present inventors have concluded that the polycrystalline structure results from the fact that Ti of the gas barrier layer is easy to change to $TiO_2$ that has a needle-like crystalline structure.

Based on the conclusion, the present inventors find that the gas barrier performance can be improved by changing the ratio of atoms of Ti of the gas barrier layer. Specifically, when the ratio of atoms of Ti of the gas barrier layer is reduced, the ratio of $TiO_2$ of the gas barrier layer is reduced accordingly. Therefore, the gas barrier performance can be improved by reducing the ratio of atoms of Ti. However, a resistance of the gas barrier layer to fluids (e.g., cleaning fluid) used in a manufacturing process may be reduced with a reduction in the ratio of atoms of Ti.

In the organic EL display, the gas barrier layer is located between an organic member (e.g., a color filter layer) and an organic EL unit having an emissive layer. It is preferable that the gas barrier layer have higher gas barrier performance on the organic member side and high resistance to the fluids on the organic EL unit side. Therefore, the present inventors have concluded that a gas barrier layer suitably used for an organic EL display can be made by reducing the ratio of atoms of Ti on the organic member side and by increasing the ratio of atoms of Ti on the organic EL unit side.

First Embodiment

Figure 2:
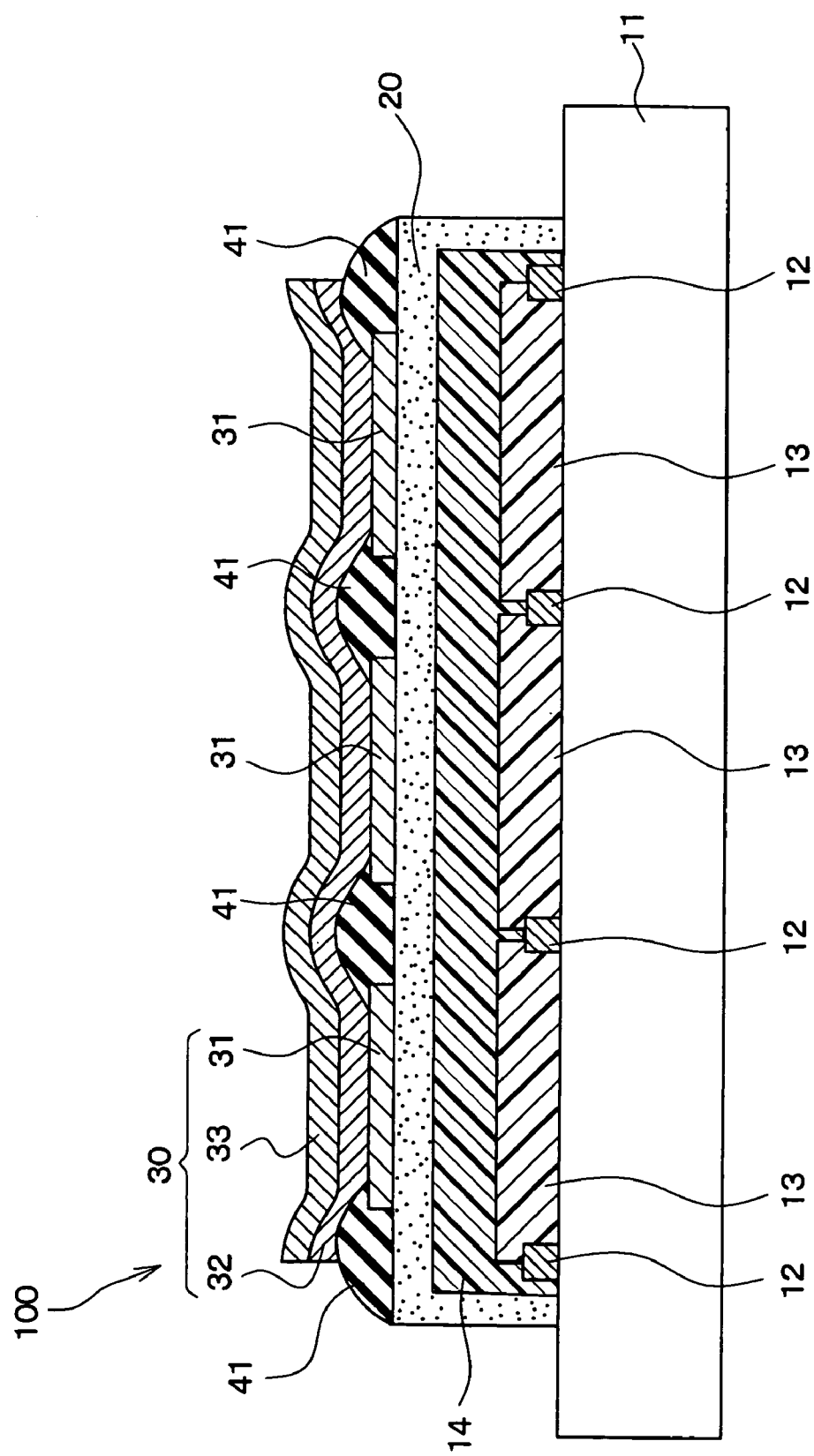
FIG. 2 is a diagram illustrating a cross-sectional view taken along line II-II of FIG. 1.

FIG. 1 illustrates a cross sectional view of a color organic electroluminescent (EL) display 100 according to a first embodiment of the present invention. FIG. 2 illustrates a cross sectional view taken along lines II-II of FIG. 1.

The organic EL display 100 mainly includes a substrate 11 having first and second sides opposite each other, a RGB color filter layer 13 (as an organic member) located on the first side of the substrate 11, an overcoat layer 14 (as an organic member) located on the color filter layer 13, a gas barrier layer 20 located on the overcoat layer 14, and an organic EL unit 30 located on the gas barrier layer 20. In the first embodiment, the substrate 11 is a transparent glass substrate. Alternatively, the substrate can be a resin substrate or the like.

A shadow mask (i.e., black matrix) 12 is formed on the first side of the substrate 11 if necessary. Each color of the color filter layer 13 is separated by the shadow mask 12. The shadow mask 12 blocks light and can be made of resin, metal, or the like.

The overcoat layer 14 is formed on the color filter layer 13 if necessary. The overcoat layer 14 serves as a planarization layer. The color filter layer 13 and the overcoat layer 14 are mainly made of acrylic resin. That is, the color filter layer 13 and the overcoat layer 14 are made of an organic material. The gas barrier layer 20 is formed on the overcoat layer 14 so that the overcoat layer 14 can be coated with the gas barrier layer 20.

The gas barrier layer 20 is a thin film made of a material having an empirical formula of AlxTiyOz. That is, the gas barrier layer 20 is a metal oxide of aluminum and titanium, and the ratio between the number of atoms of Al:Ti:O is x:y:z. One of the number x and the number y can be zero. The number of atoms of Ti relative to the total number of atoms of Al and Ti in the gas barrier layer 20 is defined as a Ti-atom ratio and given in units of atom percent (atom %). That is, the Ti-atom ratio is given by the following equation:

Ti-atom ratio=$\{y/(x+y)\}\cdot 100$ atom %.

Figure 3:
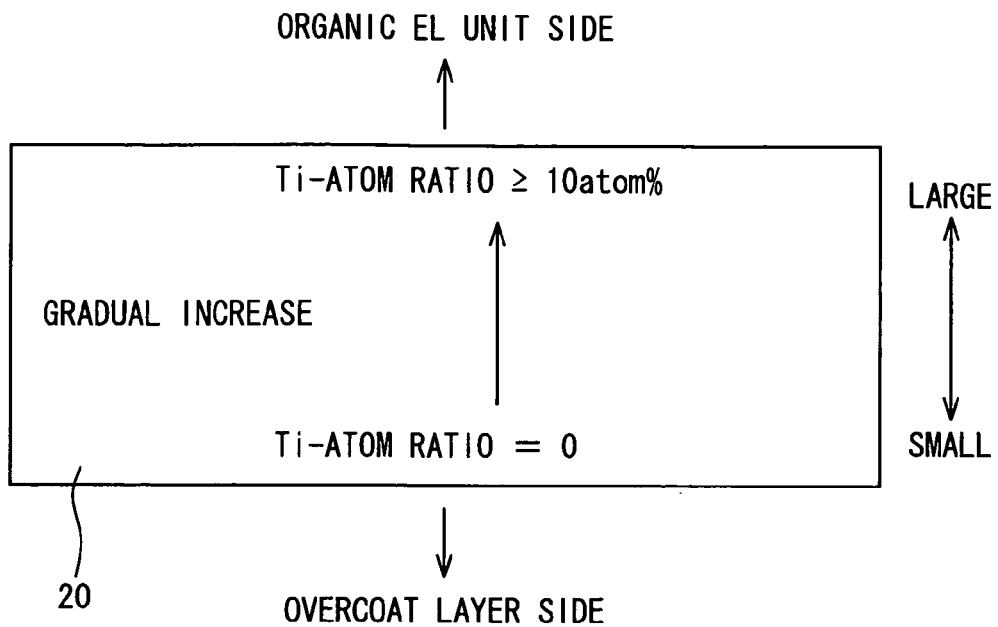
FIG. 3 is a diagram illustrating a Ti-atom ratio of a gas barrier layer of the organic EL display of the first embodiment.

FIG. 3 illustrates a cross-sectional view of the gas barrier layer 20. The Ti-atom ratio has a distribution in the gas barrier layer 20. That is, the Ti-atom ratio is not uniform in the gas barrier layer 20. In the first embodiment, the Ti-atom ratio of the gas barrier layer 20 gradually increases from a first interface (i.e., contact surface) with the overcoat layer 14 to a second interface with the organic EL unit 30.

Specifically, the Ti-atom ratio of the gas barrier layer 20 is zero (i.e., 0) atom % at the first interface with the overcoat layer 14 and is equal to or greater than ten (i.e., 10) atom % at the second interface with the organic EL unit 30. For example, the Ti-atom ratio of the gas barrier layer 20 can be one hundred (i.e., 100) atom % at the second interface with the organic EL unit 30.

In this way, the Ti-atom ratio of the gas barrier layer 20 is different between the overcoat layer 14 side and the organic EL unit 30 side. In such an approach, the gas barrier layer 20 can have not only high gas barrier performance but also high resistance to hot water and chemical agents used in a manufacturing process (e.g., cleaning process and photo-etching process) of the organic EL display 100. The reason for the above is described in detail later.

The gas barrier layer 20 can be formed by chemical vapor deposition (CVD), or physical vapor deposition (PVD) such as sputtering and vacuum vapor deposition. In the first embodiment, the gas barrier layer 20 is formed by an atomic layer deposition method, which can achieve a closely packed layer. Therefore, the gas barrier layer 20 can have not only a small thickness but also a high coatability.

The organic EL unit 30 is formed on the gas barrier layer 20. Specifically, the first side of the substrate 11 is coated with the gas barrier layer 20, and the organic EL unit 30 is formed on the first side of the substrate 11 through the gas barrier layer 20.

The organic EL unit 30 includes a pair of electrodes 31, 33 facing each other and an organic layer 32. The organic layer 32 includes and organic luminescent material and interposed between the electrodes 31, 33. For example, the organic EL unit 30 can be made as follows.

Firstly, a transparent anode 31 is formed on the gas barrier layer 20. For example, the anode 31 is made of indium tin oxide (ITO) and serves as an hole injection electrode.

In the first embodiment, the anode 31 is an ITO film having a thickness of about 120 nanometer (nm) and formed on the gas barrier layer 20 by sputtering. Then, the anode 31 on the gas barrier layer 20 is patterned, for example, by etching in the shape of stripes extending in a right-left direction of FIG. 1. The anode 31 is in direct contact with the gas barrier layer 20. That is, the organic EL unit 30 is in contact with the gas barrier layer 20 at a lower side of the anode 31.

An electrical insulation layer 40 is formed by photolithography to prevent a short-circuit at the edge of the anode 31. Likewise, an electrical insulation wall 41 is formed by photolithography to electrically separate the anode 31 from a cathode 33.

The organic layer 32 is formed on an upper side of the anode 31. The organic layer 32 includes a hole injection layer on the anode 31, a hole transporting layer on the hole injection layer, an emissive layer on the hole transporting layer, and an electron transporting layer on the emission layer. The hole injection layer is formed on the anode 31 by depositing copper phthalocyanine by a vacuum deposition method to a thickness of 20 nm, for example. The hole transporting layer is formed on the hole injection layer by depositing triphenylamine tetramer (HOMO: 5.4 eV, LOMO: 2.4 eV, Eg: 3.0 eV) by a vacuum deposition method to a thickness of 40 nm, for example.

A red emissive layer is formed on the hole transporting layer by depositing triphenylamine tetramer doped with one weight % of DCJT (HOMO: 5.3 eV, LOMO: 3.2 eV, Eg: 2.1 eV) by a vacuum deposition method to a thickness of 2 nm, for example.

A blue emissive layer is formed on the red emissive layer by depositing BALq (HOMO: 5.8 eV, LOMO: 3.0 eV, Eg: 2.8 eV) doped with one weight % of perylene (HOMO: 5.5 eV, LOMO: 2.6 eV, Eg: 2.9 eV) by a vacuum deposition method to a thickness of 40 nm, for example. The electron transporting layer is formed on the blue emissive layer by depositing aluminum chelate by a vacuum deposition method to a thickness of 20 nm, for example.

Further, an electron injection layer (not shown) is formed on the organic layer 32 by depositing lithium fluoride (LiF) by a vacuum deposition method to a thickness of 0.5 nm, for example. The cathode 33 is formed on the electron injection layer by depositing aluminum (Al) by a vacuum deposition method to a thickness of 100 nm, for example. The cathode 33 is patterned in the shape of stripes extending in a right-left direction of FIG. 2 so that the anode 31 and the cathode 33 can be perpendicular to each other.

In this way, the organic EL unit 30 is made and configured to emit white light. The organic EL display 100 is configured as a dot matrix display. Specifically, each pixel of the organic EL display 100 is the intersection of the striped anode 31 and the striped cathode 33 that are perpendicular to each other.

When a direct current having a predetermined duty ratio is applied between the anode 31 and the cathode 33 by an external circuit (not shown), a hole and an electron are injected in the emissive layer of the organic layer 32 from the anode 31 and the cathode 33, respectively, at the corresponding pixel.

The hole and electron injected in the emissive layer recombine to release energy that causes fluorescent materials (DCJT, perylene, and BAlq) of the organic layer 32 to emit light. The light is emitted through the color filter layer 13 and the substrate 11.

The organic EL display 100 can be made as follows. Firstly, the color filter layer 13 and the overcoat layer 14 are formed on the first side of the substrate 11 by a conventional spin coat method, a photolithography method, or the like.

Then, the gas barrier layer 20 is formed by an atomic layer deposition method. The atomic layer deposition is performed in the following manner. Firstly, the substrate 11, where the color filter layer 13 and the overcoat layer 14 are formed, is placed in a vacuum chamber and heated.

In the process of forming the gas barrier layer 20, a temperature of the substrate 11 is set so that atomic layer growth can be achieved. It is preferable that the temperature of the substrate 11 be less than decomposition temperatures of the color filter layer 13 and the overcoat layer 14.

In such an approach, the color filter layer 13 and the overcoat layer 14 can be protected from heat damage, and warpage of the substrate 11 can be prevented in the process of forming the gas barrier layer 20.

In the first embodiment, each of the color filter layer 13 and the overcoat layer 14 has a decomposition temperature of about 230 degrees Celsius (° C.). The temperature of the substrate 11 is set to about 225° C. in the process of forming the gas barrier layer 20. While the substrate 11 is maintained at the set temperature, material gases are alternately supplied to the vacuum chamber under diminished pressure. Thus, the gas barrier layer 20 made of AlxTiyOz is formed by an atomic layer deposition method.

For example, a basic cycle for forming a AlxTiyOz film as the gas barrier layer 20 includes five TMA cycles and one TiCl4 cycle. In each TMA cycle, trimethylaluminium (TMA) gas and $H_2O$ gas are alternately supplied to the vacuum chamber together with $N_2$ carrier gas. When the TMA cycle is repeated five times, the $TiCl_4$ cycle is performed once. In the $TiCl_4$ cycle, $TiCl_4$ gas and $H_2O$ gas are alternately supplied to the vacuum chamber.

For example, the AlxTiyOz film can be formed to a thickness of 50 nm by repeating the basic cycle one hundred times. In this case, the composition ratio between Al:Ti:O is 37:5:58. That is, x=37, y=5, and z=58. The Ti-atom ratio of the $Al_{37}Ti_5O_{58}$ layer is about 12 atom %.

The Ti-atom ratio of the AlxTiyOz film can be controlled by adjusting a ratio between the number of repetitions of the TMA cycle and the number of repetitions of the TiCl4 cycle. The ratio between the number of repetitions of the TMA cycle and the number of repetitions of the TiCl4 cycle is defined as a Ti doped ratio. For example, as the number of repetitions of the TMA cycle increases, the Ti-atom ratio of the AlxTiyOz film decreases. Conversely, as the number of repetitions of the TiCl4 cycle increases, the Ti-atom ratio of the AlxTiyOz film increases.

Figure 4:
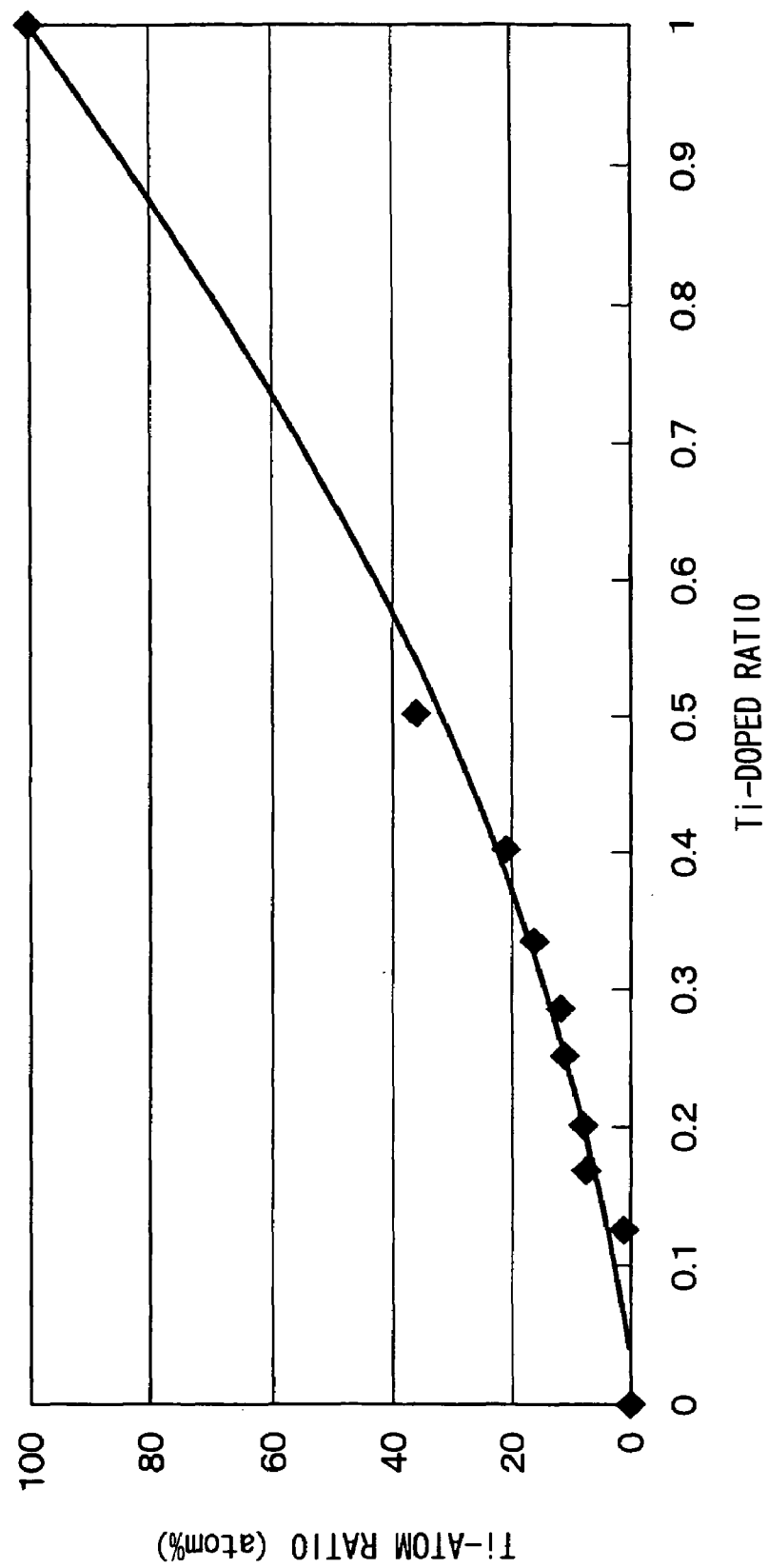
FIG. 4 is a diagram illustrating a relationship between the Ti-atom ratio and a Ti-doped ratio of the gas barrier layer.

FIG. 4 is a graph showing a result of an experiment conducted by the present inventors to determine a relationship between the Ti-atom ratio and the Ti doped ratio. As can be seen from FIG. 4, the Ti-atom ratio increases with an increase in the Ti doped ratio.

As mentioned previously, in the first embodiment, the Ti-atom ratio of the gas barrier layer 20 gradually increases from the overcoat layer 14 side to the organic EL unit 30 side in a thickness direction thereof from 0 atom % to greater than or equal to 10 atom %. That is, the gas barrier layer 20 is formed by gradually changing the Ti doped ratio in the thickness direction.

After the gas barrier layer 20 is formed in the above manner, a cleaning process is applied to the substrate 11 before a process of forming the anode 31 of the organic EL unit 30. For example, the substrate 11 is immersed in alkaline cleaning solution, pure water, and warm water of about 50° C. so that an outer surface of the gas barrier layer 20 can be cleaned.

Then, the organic EL unit 30 is formed on the gas barrier layer 20. Firstly, the ITO layer is formed on the gas barrier layer 20 by a sputtering method at a temperature of about 200° C. Then, the ITO layer on the gas barrier layer 20 is patterned in the shape of stripes by a photolithography method. Thus, the anode 31 of the organic EL unit 30 is formed on the first side of the substrate 11 to cover the gas barrier layer 20.

Then, the insulation layer 40 is formed between adjacent stripes of the anode 31 by a photolithography method. Then, the insulation wall 41 is formed on the insulation layer 40 by a photolithography method. Then, the hole injection layer, the hole transporting layer, the emissive layer, and the electron transporting layer are formed on the anode 31 by a vacuum deposition method at a room temperature so that the organic layer 32 can be formed on the anode 31.

Then, the electron injection layer is formed by depositing LiF on the organic layer 32 by a vacuum deposition method. Then, the cathode 33 is formed on the electron injection layer by a vacuum deposition at a room temperature. In this way, the organic EL display 100 shown in FIGS. 1 and 2 is made.

If necessary, the organic EL unit 30 can be sealed in inert gas (e.g., $N_2$ gas) by a stainless or glass lid with a desiccant agent to prevent water from entering the organic EL display 100 from the organic EL unit 30 side. The inlet gas can contain a small amount of oxygen.

As described above, according to the first embodiment, the Ti-atom ratio of the gas barrier layer 20 gradually increases from the first interface with the overcoat layer 14 to the second interface with the organic EL unit 30. Specifically, the gas barrier layer 20 includes a first portion having the Ti-atom ratio of 0 atom % at the first interface and a second portion having the Ti-atom ratio of greater than or equal to 10 atom % at the second interface.

The gas barrier layer 20 is configured to include the second portion having the Ti-atom ratio of greater than or equal to 10 atom % at the second interface with the organic EL unit 30 for the following reason. The present inventors have conducted an experiment to determine a relationship between the Ti-atom ratio of the AlxTiyOz film and a resistance of the AlxTiyOz film to solutions used in a post-process. In the experiment, a single-layer AlxTiyOz film is used.

Figure 5:
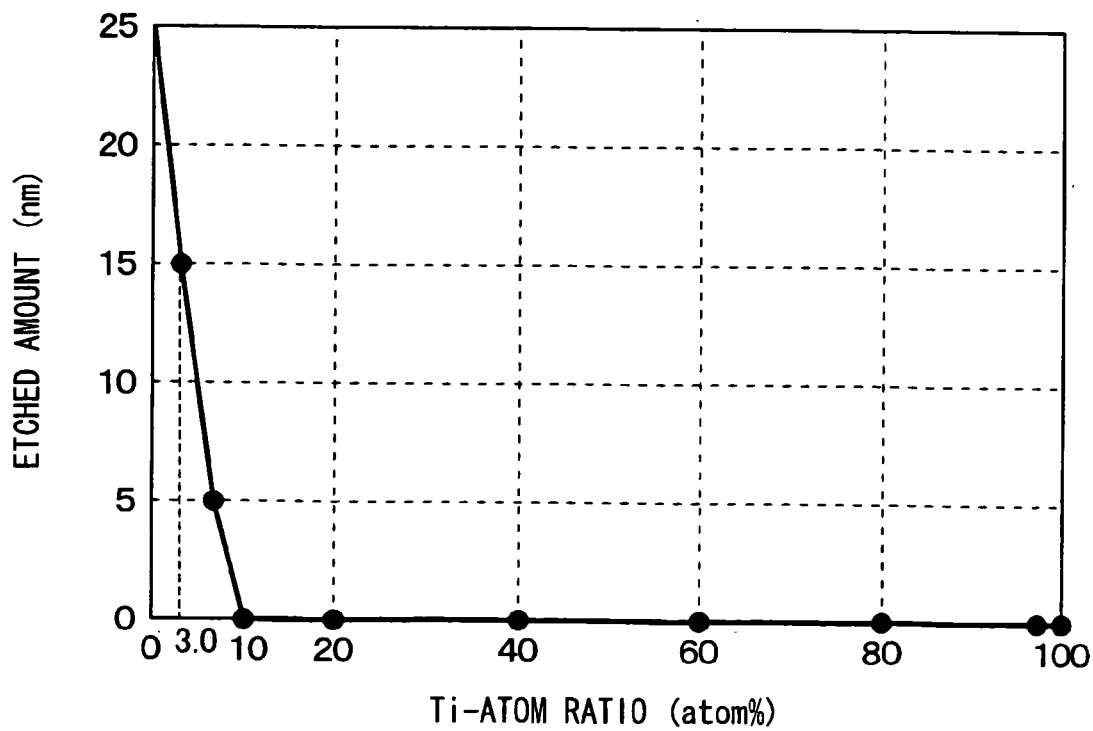
FIG. 5 is a diagram illustrating a relationship between the Ti-atom ratio and the amount of the gas barrier layer etched by a cleaning fluid.

FIG. 5 shows a first example of results of the experiment and illustrates a relationship between the Ti-atom ratio of the AlxTiyOz film and the amount of the AlxTiyOz film etched by cleaning fluid used in a cleaning process. The cleaning fluid is warm water of 50° C.

In the first example, the AlxTiyOz film formed on the substrate 11 is immersed in the warm water for thirty minutes, and then the amount of the AlxTiyOz film etched is measured by measuring the thickness of the AlxTiyOz film. This measurement is repeated by changing the Ti-atom ratio of the AlxTiyOz film.

As can be seen from FIG. 5, when the Ti-atom ratio is greater than or equal to 10 atom %, the amount of the AlxTiyOz film etched by the warm water substantially becomes zero. Therefore, when the Ti-atom ratio is greater than or equal to 10 atom %, the AlxTiyOz film can have enough resistance to the warm water.

Figure 6:
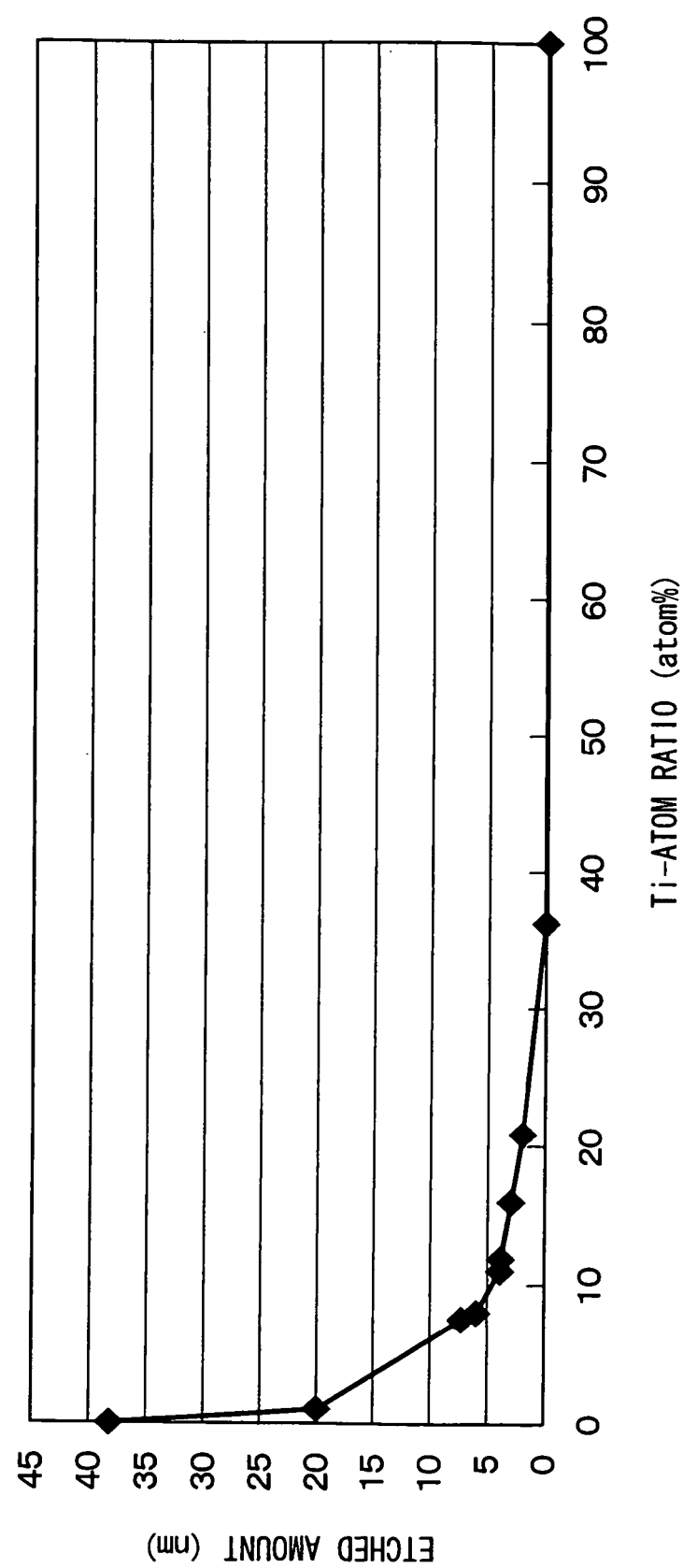
FIG. 6 is a diagram illustrating a relationship between the Ti-atom ratio and the amount of the gas barrier layer etched by a developing fluid.

FIG. 6 shows a second example of results of the experiment and illustrates a relationship between the Ti-atom ratio of the AlxTiyOz film and the amount of the AlxTiyOz film etched by a developing fluid used in a photo-etching process for forming the organic EL unit 30. The developing fluid is tetramethyl ammonium hydroxide (TMAH) solution having a concentration of 2.38%. In the second example, the AlxTiyOz film formed on the substrate 11 is immersed in the TMAH solution for five minutes, and then the amount of the AlxTiyOz film etched is measured by measuring the thickness of the AlxTiyOz film. This measurement is repeated while changing the Ti-atom ratio of the AlxTiyOz film.

As can be seen from FIG. 6, when the Ti-atom ratio of the AlxTiyOz film is greater than or equal to 10 atom %, the amount of the AlxTiyOz film etched by the TMAH solution substantially becomes zero. Therefore, when the Ti-atom ratio is greater than or equal to 10 atom %, the AlxTiyOz film can have enough resistance to the TMAH solution. Conversely, when the Ti-atom ratio of the AlxTiyOz film is less than 10 atom %, the AlxTiyOz film dissolves in the TMAH solution or has a surface roughness, which is observed through a scanning electron microscope (SEM). That is, when the Ti-atom ratio of the AlxTiyOz film is less than 10 atom %, the AlxTiyOz film cannot have enough resistance to the TMAH solution.

In the post-process, the gas barrier layer 20 is exposed to the solutions at the second interface with the organic EL unit 30. The gas barrier layer 20 is configured to include the second portion having the Ti-atom ratio of greater than or equal to 10 atom % at the second interface with the organic EL unit 30. In such an approach, the gas barrier layer 20 can have enough resistance to the solutions used in the post-process.

It is preferable that the thickness of the second portion from the second interface be greater than or equal to 10 nm in the thickness direction of the gas barrier layer 20. In such an approach, it is ensured that the gas barrier layer 20 has enough resistance to various types of processing including the TMAH solution etching.

Figure 7:
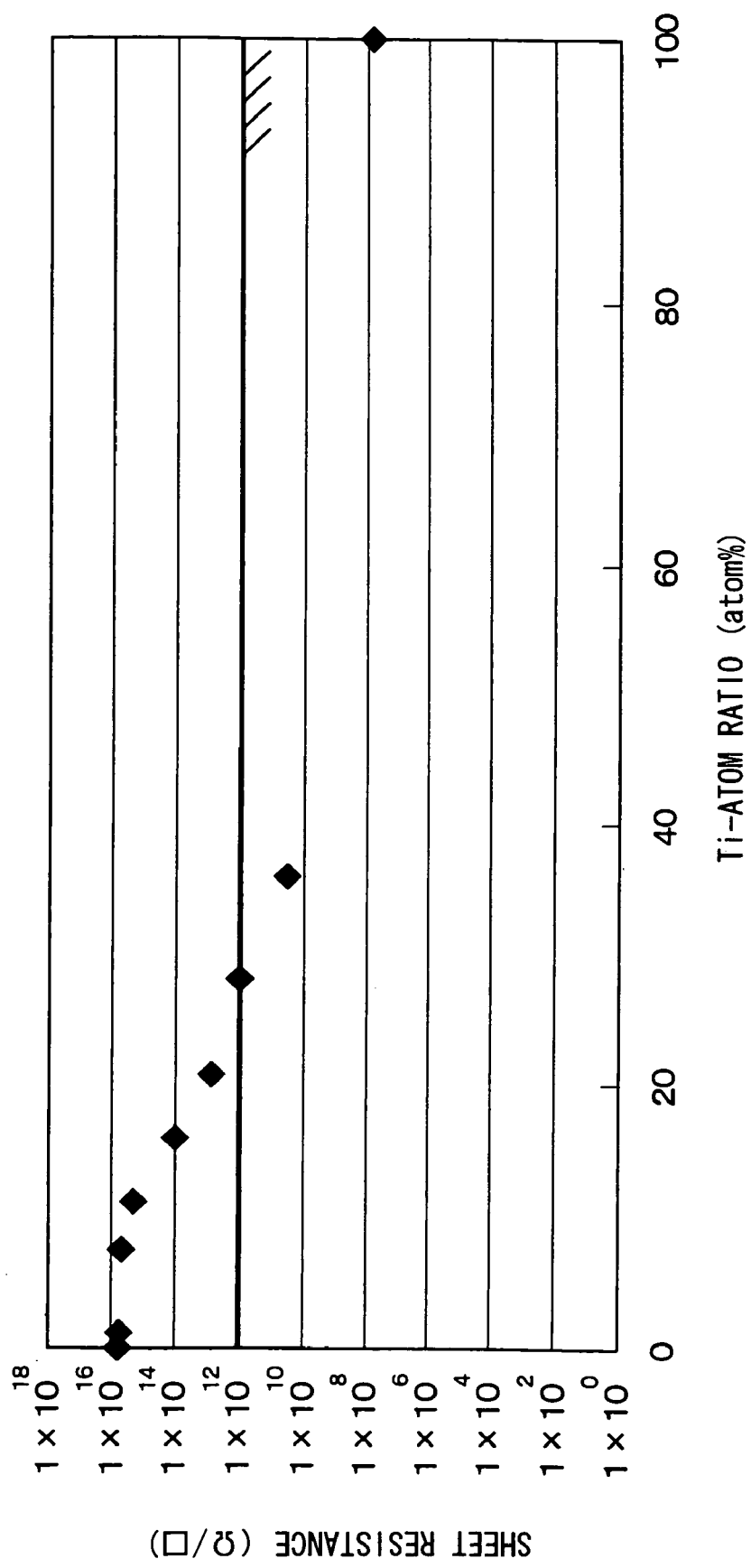
FIG. 7 is a diagram illustrating a relationship between the Ti-atom ratio and a sheet resistance of the gas barrier layer.

FIG. 7 illustrates a result of an experiment conducted by the present inventors to determine a relationship between the Ti-atom ratio of the AlxTiyOz film and a sheet resistance of the AlxTiyOz film. In the experiment, the thickness of the AlxTiyOz film is set to 50 nm. As can be seen from FIG. 7, the sheet resistance of the AlxTiyOz film decreases in an increase in the Ti-atom ratio.

When the sheet resistance of the AlxTiyOz film is less than $1 \times 10^{12} \Omega/\square$ (ohms per square), a leak current may flow between adjacent conductors. The leak current may cause a halo in an image displayed by the organic EL display 100. The leak current can be prevented by adjusting the Ti-atom ratio of the AlxTiyOz film in such a manner that the sheet resistance of the AlxTiyOz film is greater than or equal to $1 \times 10^{12} \Omega/\square$. Alternatively, the leak current can be prevented by forming additional electrical insulation layer between adjacent conductors.

The gas barrier layer 20 includes the first portion having the Ti-atom ratio of 0 atom % at the first interface with the overcoat layer 14 for the following reason. As mentioned previously, when Ti of the gas barrier layer 20 changes to the $TiO_2$ having a needle-like crystalline structure, the gas barrier layer 20 locally changes from an amorphous structure to a polycrystalline structure that reduces gas barrier performance of the gas barrier layer 20.

Since a volatile substance such as moisture exists at the first interface with the overcoat layer 14, the gas barrier layer 20 needs to have an amorphous structure at the first interface with the overcoat layer 14 to prevent entry of the moisture.

The change of the Ti of the gas barrier layer 20 to the $TiO_2$ is unlikely to occur at the first portion having the Ti-atom ratio of 0 atom %. Since the gas barrier layer 20 includes the first portion at the first interface with the overcoat layer 14, the gas barrier layer 20 can have gas barrier performance enough to prevent the entry of the moisture.

Figure 8:
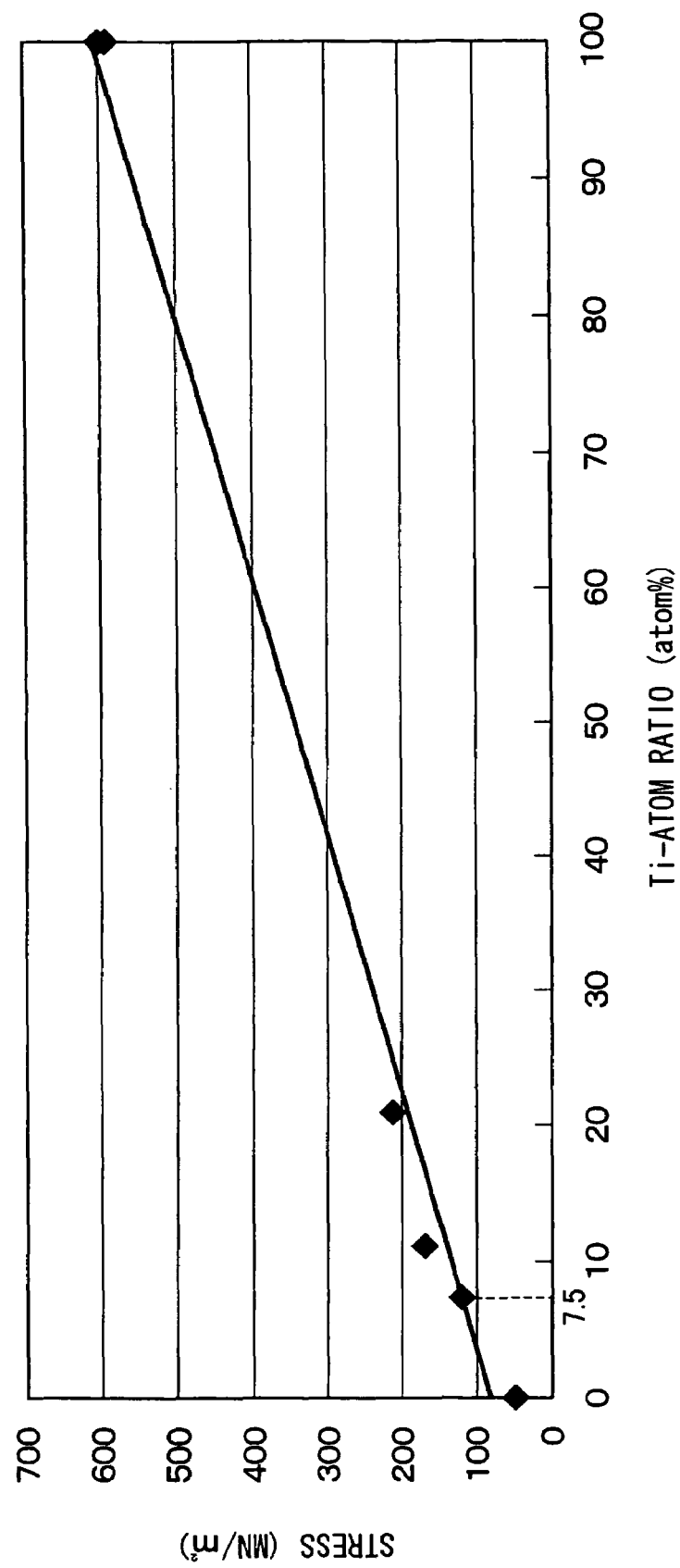
FIG. 8 is a diagram illustrating a relationship between the Ti-atom ratio and a film stress of the gas barrier layer.

FIG. 8 illustrates a result of an experiment conducted by the present inventors to determine a relationship between the Ti-atom ratio of the AlxTiyOz film and a thin film stress ($MN/m^2$) of the AlxTiyOz film. In the experiment, a single-layer AlxTiyOz film is used. As can be seen from FIG. 8, the film stress of the AlxTiyOz film decreases in an increase in the Ti-atom ratio.

The gas barrier layer 20 including the first portion having the reduced Ti-atom ratio can have the following advantages as compared to a typical gas barrier layer having an uniform Ti-atom ratio.

Firstly, the gas barrier layer 20 can have a small film stress as compared to the typical gas barrier layer at the same thickness. Therefore, warpape and crack in the substrate 11 can be reduced by using the gas barrier layer 20. Secondly, the gas barrier layer 20 can have a large thickness as compared to the typical gas barrier layer at the same film stress. Therefore, the gas barrier performance can be increased by using the gas barrier layer 20. Finally, the total amount of Ti included in the gas barrier layer 20 is less than the total amount of Ti included in the typical gas barrier layer. Therefore, an electrical resistance is increased by using the gas barrier layer 20. Thus, the leak current flowing between the conductors is prevented so that the halo in the image can be prevented.

Therefore, when the gas barrier layer 20 includes the first portion having the Ti-atom ratio of 0 atom % at the first interface with the overcoat layer 14, the gas barrier layer 20 can have high gas barrier performance. Further, the gas barrier layer 20 can have a reduced film stress and an increased electrical insulation.

As described above, according to the first embodiment, the gas barrier layer 20 includes the first portion having the Ti-atom ratio of 0 atom % at the first interface with the overcoat layer 14, which is made of an organic material. In such an approach, the gas barrier layer 20 can have high gas barrier performance enough to prevent the entry of volatile substance from the overcoat layer 14 side. Further, the gas barrier layer 20 includes the second portion having the Ti-atom ratio of greater than or equal to 10 atom % at the second interface with the organic EL unit 30. In such an approach, the gas barrier layer 20 can have enough resistance to the solutions used in the process of forming the organic EL unit 30.

The gas barrier layer 20 is formed at the temperature less than the decomposition temperatures of the color filter layer 13 and the overcoat layer 14 by an atomic deposition method while the Ti-atom ratio of the gas barrier layer 20 is changed by changing the Ti-doped ratio in the thickness direction of the gas barrier layer 20. Thus, the gas barrier layer 20 can include the first portion having the Ti-atom ratio of 0 atom % at the first interface with the overcoat layer 14 and the second portion having the Ti-atom ratio of greater than or equal to 10 atom % at the second interface with the organic EL unit 30.

Since the gas barrier layer 20 is formed at the temperature less than the decomposition temperatures of the color filter layer 13 and the overcoat layer 14, the color filter layer 13 and the overcoat layer 14 can be protected from heat damage during the process of forming the gas barrier layer 20.

Second Embodiment

Figure 9:
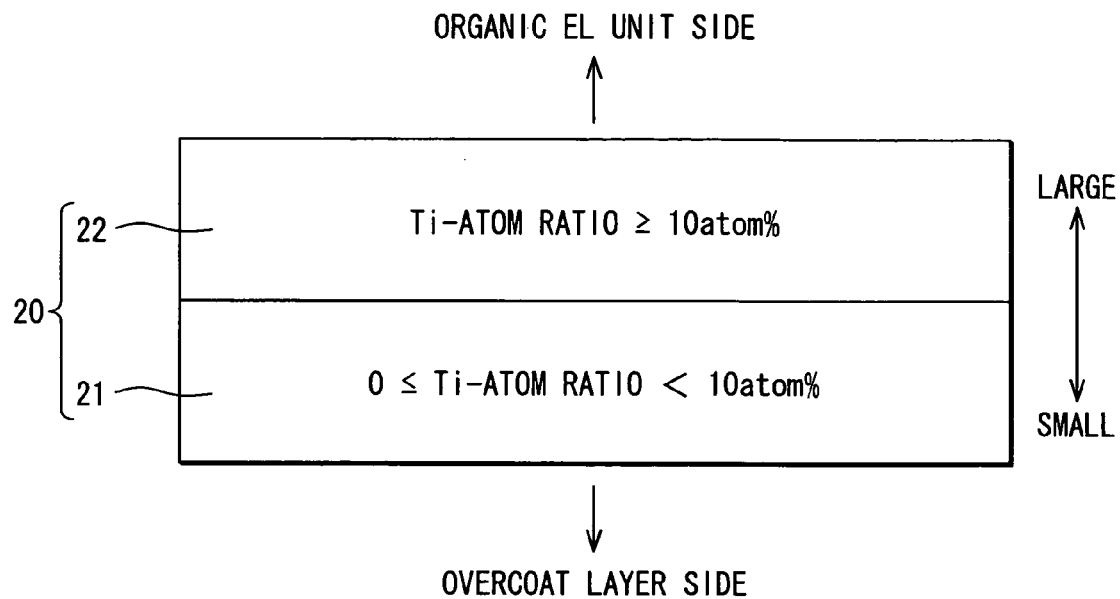
FIG. 9 is a diagram illustrating a Ti-atom ratio of a gas barrier layer according to a second embodiment of the present invention.

FIG. 9 illustrates a cross-sectional view of a gas barrier layer 20 of an organic EL display according to a second embodiment of the present invention.

In the second embodiment, the gas barrier layer 20 includes first and second layers 21, 22 stacked together. The first layer 21 is located at the first interface with the overcoat layer 14, and the second layer 22 is located at the second interface with the organic EL unit 30. The first layer 21 includes the first portion having the Ti-atom ratio of 0 atom % at least at the first interface with the overcoat layer 14. The Ti-atom ratio of the first layer 21 can be 0 atom % only at the first interface with the overcoat layer 14. Alternatively, the Ti-atom ratio of the entire first layer 21 can be constant at 0 atom % so that the first layer 21 can be $Al_2O_3$. Alternatively, the Ti-atom ratio of the first layer 21 can increase in a range from 0 atom % to less than 10 atom % from the first interface with the overcoat layer 14 to an interface with the second layer 22.

The second layer 22 includes the second portion having the Ti-atom ratio of greater than or equal to 10 atom % at least at the second interface with the organic EL unit 30. The Ti-atom ratio of the second layer 22 can be greater than or equal to 10 atom % only at the second interface with the organic EL unit 30. Alternatively, the Ti-atom ratio of the entire second layer 22 can be constant at a value greater than or equal to 10 atom %. Alternatively, the Ti-atom ratio of the second layer 22 can increase in a range from 0 atom % to greater than or equal to 10 atom % from an interface with the first layer 21 to the second interface with the organic EL unit 30.

Like the first embodiment, the first layer 21 is formed on the overcoat layer 14 by an atomic layer deposition method while controlling the Ti-atom ratio. Then, the second layer 22 is formed on the first layer 21 by an atomic layer deposition method while controlling the Ti-atom ratio. Thus, the gas barrier layer 20 including the first and second layers 21, 22 can be formed.

It is preferable that the thickness of the first portion of the gas barrier layer 20 from the first interface with the overcoat layer 14 be greater than or equal to 20 nm in the thickness direction of the gas barrier layer 20. For example, when the Ti-atom ratio of the entire first layer 21 is 0 atom %, it is preferable that the thickness of the first layer 21 be greater than or equal to 20 nm. It is preferable that the thickness of the second portion of the gas barrier layer 20 from the second interface with the organic EL unit 30 be greater than or equal to 10 nm in the thickness direction of the gas barrier layer 20. For example, when the Ti-atom ratio of the entire second layer 22 is greater than or equal to 10 atom %, it is preferable that the thickness of the second layer 22 be greater than or equal to 10 nm.

As described above, according to the second embodiment, the gas barrier layer 20 includes the first portion having the Ti-atom ratio of 0 atom % at the first interface with the overcoat layer 14, which is made of an organic material. Therefore, the gas barrier layer 20 can have high gas barrier performance. Further, the gas barrier layer 20 includes the second portion having the Ti-atom ratio of greater than or equal to 10 atom % at the second interface with the organic EL unit 30. Therefore, the gas barrier layer 20 can have enough resistance to the solutions used in the process of forming the organic EL unit 30.

Third Embodiment

Figure 10:
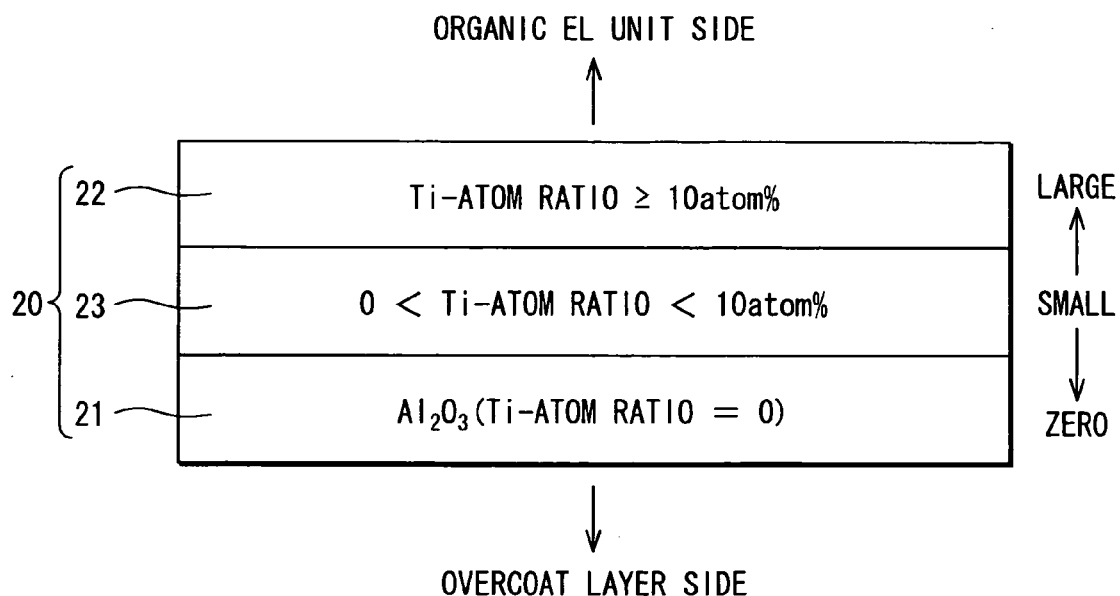
FIG. 10 is a diagram illustrating a Ti-atom ratio of a gas barrier layer according to a third embodiment of the present invention.

FIG. 10 illustrates a cross-sectional view of a gas barrier layer 20 of an organic EL display according to a third embodiment of the present invention.

In the third embodiment, the gas barrier layer 20 includes first, second, and third layers 21-23 stacked together. The first layer 21 is located at the first interface with the overcoat layer 14. The Ti-atom ratio of the entire first layer 21 is constant at a value greater than or equal to 10 atom %. The second layer 22 is located at the second interface with the organic EL unit 30. The Ti-atom ratio of the entire second layer 22 is constant at 0 atom %.

The third layer 23 is interposed between the first and second layers 21, 22. The Ti-atom ratio of the third layer 23 is greater than 0 atom % and less than 10 atom %. The Ti-atom ratio of the entire third layer 23 can be constant at a value greater than 0 atom % and less than 10 atom %. Alternatively, the Ti-atom ratio of the third layer 23 can increase from an interface with the first layer 21 to an interface with the second layer 22 in a range greater than 0 atom % and less than 10 atom %.

Like the first embodiment, the first layer 21 is formed on the overcoat layer 14 by an atomic layer deposition method. Then, the third layer 23 is formed on the first layer 21 by an atomic layer deposition method. Then, the second layer 22 is formed on the third layer 23 by an atomic layer deposition method. Thus, the gas barrier layer 20 including the first, second, and third layers 21-23 is formed. It is preferable that the thickness of the first layer 21 be greater than or equal to 20 nm in the thickness direction of the gas barrier layer 20. It is preferable that the thickness of the second layer 22 be greater than or equal to 10 nm in the thickness direction of the gas barrier layer 20.

As described above, according to the third embodiment, the gas barrier layer 20 includes the first layer 21 that has the Ti-atom ratio of 0 atom % and located at the first interface with the overcoat layer 14. Therefore, the gas barrier layer 20 can have high gas barrier performance. Further, the gas barrier layer 20 includes the second layer 22 that has the Ti-atom ratio of greater than or equal to 10 atom % and located at the second interface with the organic EL unit 30. Therefore, the gas barrier layer 20 can have enough resistance to the solutions used in the process of forming the organic EL unit 30.

The present inventors have made a color organic EL display having the gas barrier layer 20 according to the embodiments and conducted an experiment using the organic EL display to evaluate the effect of the gas barrier layer 20.

The organic EL display used in the experiment is made as follows. A mother substrate made of alkali-free glass and having a size of 300×400 mm is prepared. Multiple color filter layers 13 are formed on the mother substrate to form multiple organic EL displays, each of which has a panel size of (diagonal) 3.5 inch. Here, it is noted that the mother substrate is ultimately divided into multiple substrates 11 on a color filter layer 13 basis so that the organic EL displays can be formed. After the color filter layers 13 are formed on the mother substrate, the gas barrier layer 20 is formed on the color filter layers 13 by an atomic layer deposition method at the temperature of 225° C., which is less than the decomposition temperature of the color filter layers 13.

Then, the anode 31 made of indium tin oxide (ITO) and an auxiliary electrode made of molybdenum (Mo) alloy are formed on the gas barrier layer 20 by sputtering and patterned by etching. Then, the insulation layer 40 and the insulation wall 41 are formed on the anode 31 by photolithography.

Then, the organic layer 32 and the cathode 33 are formed in the manner described in the first embodiment so that the organic EL unit 30 can be formed. Then, the organic EL unit 30 is sealed in nitrogen gas by a glass lid with a desiccant agent. Finally, the mother substrate is divided into multiple substrates 11 on a color filter layer 13 basis, thereby forming multiple organic EL displays, each of which has the panel size of (diagonal) 3.5 inch. In this way, multiple organic EL displays are formed from a single mother substrate.

The experiment has been conducted using seven different types of samples S1-S7 of the gas barrier layer 20. Five same mother substrates M1-M5 are used for each sample S1-S7. The sample S1 corresponds to a comparative example. The samples S2-S7 correspond to the embodiments.

In the sample S1 corresponding to the comparative example, the gas barrier layer 20 is a single layer AlxTiyOz having a constant Ti-atom ratio of 12 atom % and a thickness of 30 nm.

In the sample S2 corresponding to the second embodiment shown in FIG. 9, the gas barrier layer 20 includes the first and second layers 21, 22 stacked together. The first layer 21 has a constant Ti-atom ratio of 0 atom % and a thickness of 20 nm. The second layer 22 has a constant Ti-atom ratio of 12 atom % and a thickness of 10 nm.

In the sample S3 corresponding to the third embodiment shown in FIG. 10, the gas barrier layer 20 includes the first, second, and third layers 21-23 stacked together. The first layer 21 has a constant Ti-atom ratio of 0 atom % and a thickness of 10 nm. The second layer 22 has a constant Ti-atom ratio of 12 atom % and a thickness of 10 nm. The third layer 23, which is interposed between the first and second layers 21, 22, has a constant Ti-atom ratio of 7 atom % and a thickness of 10 nm.

In the sample S4 corresponding to the third embodiment shown in FIG. 10, the gas barrier layer 20 includes the first, second, and third layers 21-23 stacked together. The first layer 21 has a constant Ti-atom ratio of 0 atom % and a thickness of 10 nm. The second layer 22 has a constant Ti-atom ratio of 12 atom % and a thickness of 10 nm. The third layer 23 has a thickness of 10 nm. A Ti-atom ratio of the third layer 23 gradually increases from greater than 0 atom % to less than or equal to 12 atom % from an interface with the first layer 21 to an interface with the second layer 22.

In the sample S5 corresponding to the first embodiment shown in FIG. 3, the gas barrier layer 20 is a single layer AlxTiyOz having a thickness of 60 nm. A Ti-atom ratio of the gas barrier layer 20 gradually increases from 0 atom % to 12 atom % from an interface with the color filter layer 13 to an interface with the organic EL unit 30.

In the sample S6 corresponding to the second embodiment shown in FIG. 9, the gas barrier layer 20 includes the first and second layers 21, 22 stacked together. The first layer 21 has a constant Ti-atom ratio of 0 atom % and a thickness of 10 nm. The second layer 22 has a thickness of 20 nm. A Ti-atom ratio of the second layer 22 gradually increases from 0 atom % to 28 atom % from an interface with the first layer 21 to an interface with the organic EL unit 30.

In the sample S7 corresponding to the second embodiment shown in FIG. 9, the gas barrier layer 20 includes the first and second layers 21, 22 stacked together. The first layer 21 has a thickness of 40 nm. A Ti-atom ratio of the first layer 21 gradually increases from 0 atom % to 12 atom % from an interface with the color filter layer 13 to an interface with the second layer 22. The second layer 22 has a constant Ti-atom ratio of 12 atom % and a thickness of 10 nm.

As described above, in the process of making the organic EL unit 30, the gas barrier layer 20 is exposed to fluids such as weakly alkaline cleaning fluid, warm water, developing fluid (e.g., TMAH), and etching fluid (e.g. aqua regia). Therefore, it is required that the gas barrier layer 20 have resistances to the fluids. Further, it is required that the gas barrier layer 20 have gas barrier performance enough to prevent entry of the fluids into the color filter layer 13 and to prevent release of gas from the color filter layer 13.

In the experiment, the organic EL displays made in the manner described above are left in an atmosphere of 100° C. for 100 hours and then activated so as to emit light. In this condition, the presence or absence of a dark spot on a display panel of each display is examined under a microscope.

FIG. 11 shows a result of the dark spot examination. As can be seen from FIG. 11, nine display panels formed from the five mother boards M1-M5 using the sample S1 are dark-spotted. Conversely, no display panel formed from the five mother boards M1-M5 using the samples 2-7 is dark-spotted. Thus, the result of the experiment shows that the gas barrier layer 20 according to the embodiments can have high gas barrier performance.

The present inventors have conducted further analysis on the sample S2 corresponding to the second embodiment. In the sample S2, the gas barrier layer 20 includes a first portion (i.e., first layer 21) having the Ti-atom ratio of 0 atom % and a second portion (i.e., second layer 22) having the Ti-atom ratio of greater than or equal to 10 atom % (i.e., 12 atom %). The thickness of the first portion from the first interface with the overcoat layer 14 (i.e., color filter layer 13) is greater than or equal to 20 nm in the thickness direction of the gas barrier layer 20. The thickness of the second portion from the second interface with the organic EL unit 30 is greater than or equal to 10 nm in the thickness direction of the gas barrier layer 20. That is, the sample S2 meets a preferable condition described in the second embodiment. As described above, no display panel using the sample S2 is dark-spotted.

The present inventors have conducted the experiment using five different types of samples S2a-S2e, each of which has a similar structure to the sample S2 and does not meet the preferable condition.

In the sample S2a, the gas barrier layer 20 includes the first and second layers 21, 22 stacked together. The first layer 21 has a constant Ti-atom ratio of 0 atom % and a thickness of 10 nm. The second layer 22 has a constant Ti-atom ratio of 12 atom % and a thickness of 10 nm.

In the sample S2b, the gas barrier layer 20 includes the first and second layers 21, 22 stacked together. The first layer 21 has a constant Ti-atom ratio of 0 atom % and a thickness of 10 nm. The second layer 22 has a constant Ti-atom ratio of 12 atom % and a thickness of 20 nm.

In the sample S2c, the gas barrier layer 20 is a single layer AlxTiyOz having a thickness of 30 nm. A Ti-atom ratio of the gas barrier layer 20 gradually increases from 0 atom % to 12 atom % from an interface with the color filter layer 13 to an interface with the organic EL unit 30.

In the sample S2d, the gas barrier layer 20 includes the first and second layers 21, 22 stacked together. The first layer 21 has a constant Ti-atom ratio of 0 atom % and a thickness of 10 nm. The second layer 22 has a thickness of 10 nm. A Ti-atom ratio of the second layer 22 gradually increases from 0 atom % to 28 atom % from an interface with the first layer 21 to an interface with the organic EL unit 30.

In the sample S2e, the gas barrier layer 20 includes the first and second layers 21, 22 stacked together. The first layer 21 has a thickness of 20 nm. A Ti-atom ratio of the first layer 21 gradually increases from 0 atom % to 12 atom % from an interface with the color filter layer 13 to an interface with the second layer 22. The second layer 22 has a constant Ti-atom ratio of 12 atom % and a thickness of 10 nm.

The result of the analysis shows that the number of dark-spotted panels is drastically reduced by using the samples S2a-S2e compared to using the sample S1. However, whereas no display panel constructed with the sample S2, which satisfies the preferable condition, is dark-spotted, some display panels constructed with the samples S2a-S2e, which do not satisfy the preferable condition, are dark-spotted. In view of the above, it can be considered that the dark-spot on the display panel can be prevented by using the gas barrier layer that satisfies the preferable condition.

By the way, in the sample S3, the thickness of the first layer 21 having the Ti-atom ratio of 0 atom % is 10 nm. That is, the sample S3 does not satisfies the preferable condition. However, as shown in FIG. 11, no display panel constructed with the sample S3 is dark-spotted. Therefore, it is not absolutely essential for the gas barrier layer to satisfy the preferable condition.

Modifications

The embodiments described above may be modified in various ways. For example, the overcoat layer 14 can be eliminated from the organic EL display 100. A resin substrate such as a flexible printed board can be used in addition to or instead of at least one of the color filter layer 13 and the overcoat 15 layer 14. For example, the gas barrier layer 20 and the organic EL unit 30 can be directly formed on the resin substrate without the color filter layer 13. That is, the organic EL display 100 can be configured as a monochrome display.

The gas barrier layer 20 can be formed by a vapor deposition method other than an atomic layer deposition method. For example, when the gas 20 barrier layer 20 is formed by a sputtering method, $Al_2O_3$ and $TiO_2$ are used as targets and alternately deposited while controlling deposition speeds.

The structure of the organic EL unit 30 cannot be limited to the structure described in the embodiments. The organic EL unit 30 can be constructed with materials and films used in a typical organic EL unit. Further, the organic EL 25 unit 30 can be constructed with materials and films available in the future.

Such changes and modifications are to be understood as being within the scope of the present invention as defined by the appended claims.

What is claimed is:

1. An organic EL display comprising:
a member made of an organic material;
a gas barrier layer on the member; and
an organic EL unit on the gas barrier layer,
wherein the gas barrier layer comprises AlxTiyOz, wherein Al represents aluminum, Ti represents titanium, O represents oxygen, x represents the ratio of atoms of Al, y represents the ratio of atoms of Ti, and z represents the ratio of atoms of O,
wherein a Ti-atom ratio of the gas barrier layer is given in the units of atom % and defined by the following equation: Ti-atom ratio=$\{y/(x+y)\} \cdot 100$,
wherein the gas barrier layer has a first portion at a first interface with the member and a second portion at a second interface with the organic EL unit,
wherein the Ti-atom ratio of the first portion is 0 atom %,
wherein the Ti-atom ratio of the second portion is greater than or equal to 10 atom %,
wherein the first portion of the gas barrier layer has a first thickness from the first interface toward the second interface,
wherein the first thickness is greater than or equal to 20 nanometers,
wherein the second portion of the gas barrier layer has a second thickness from the second interface toward the first interface, and
wherein the second thickness is greater than or equal to 10 nanometers.

2. The organic EL display according to claim 1,
wherein the Ti-atom ratio of the gas barrier layer gradually increases from the first interface with the member to the second interface with the organic EL unit.

3. The organic EL display according to claim 1,
wherein the gas barrier layer includes first and second layers stacked together,
wherein the first layer is located at the first interface with the member to include the first portion having the Ti-atom ratio of 0 atom %, and
wherein the second layer is located at the second interface with the organic EL unit to include the second portion having the Ti-atom ratio of greater than or equal to 10 atom %.

4. The organic EL display according to claim 1,
wherein the gas barrier layer includes first, second, and third layers stacked together,
wherein the first layer is located at the first interface with the member and has the Ti-atom ratio that is constant at 0 atom %, wherein the second layer is located at the second interface with the organic EL unit and has the Ti-atom ratio that is constant at a value greater than or equal to 10 atom %, and wherein the third layer is interposed between the first and second layers and has the Ti-atom ratio that is constant at a value greater than 0 atom % and less than 10 atom %.

5. The organic EL display according to claim 1, wherein the gas barrier layer is an amorphous film, and wherein no diffraction image other than a halo pattern is observed when the gas barrier layer is examined with a X-ray diffraction method or an electron diffraction method.

6. The organic EL display according to claim 1, wherein the member includes at least one of a color filter layer and an overcoat layer.

7. The organic EL display according to claim 1, wherein the member includes a resin substrate.

8. A method of making an organic EL display of claim 1, the method comprising:

forming the gas barrier layer on the member at a temperature less than a decomposition temperature of the member by a vapor deposition method in such a manner that the Ti-atom ratio of the first portion is 0 atom % and that the Ti-atom ratio of the second portion is greater than or equal to 10 atom %; and forming the organic EL unit on the gas barrier layer.

9. The method according to claim 8, wherein the vapor deposition method is an atomic layer deposition method.

* * * * *